(12) United States Patent
Chen

(10) Patent No.: US 9,209,341 B2
(45) Date of Patent: Dec. 8, 2015

(54) THIN FILM SOLAR CELL AND METHOD OF FORMING SAME

(71) Applicant: TSMC Solar Ltd., Taichung (TW)

(72) Inventor: Shih-Wei Chen, Kaohsiung (TW)

(73) Assignee: TSMC Solar Ltd., Taichung (TW)

( * ) Notice: Subject to any disclaimer, the term of this patent is extended or adjusted under 35 U.S.C. 154(b) by 24 days.

(21) Appl. No.: 14/183,555

(22) Filed: Feb. 19, 2014

(65) Prior Publication Data

US 2015/0236187 A1 Aug. 20, 2015

(51) Int. Cl.
*H01L 21/00* (2006.01)
*H01L 31/18* (2006.01)
*H01L 31/0216* (2014.01)
*H01L 31/032* (2006.01)
*H01L 31/0296* (2006.01)
*H01L 31/06* (2012.01)

(52) U.S. Cl.
CPC ............ *H01L 31/18* (2013.01); *H01L 31/0296* (2013.01); *H01L 31/02167* (2013.01); *H01L 31/0322* (2013.01); *H01L 31/06* (2013.01)

(58) Field of Classification Search
CPC combination set(s) only.
See application file for complete search history.

(56) References Cited

U.S. PATENT DOCUMENTS

| | | | |
|---|---|---|---|
| 2012/0006398 A1* | 1/2012 | Nguyen | H01L 31/022425 136/256 |
| 2012/0060900 A1* | 3/2012 | Kodenkandath | H01L 31/0322 136/249 |

* cited by examiner

*Primary Examiner* — Marvin Payen
(74) *Attorney, Agent, or Firm* — Duane Morris LLP

(57) ABSTRACT

A solar cell device and a method of fabricating the device is described. The solar cell is fabricated by forming a back contact layer on a front side of a substrate, forming an absorber layer on the back contact layer, applying a protective layer on a back side of the substrate, depositing a buffer layer on the absorber layer. Excess buffer materials are deposited on the substrate back side, and the protective layer with excess buffer materials are removed.

20 Claims, 5 Drawing Sheets

THIN FILM SOLAR CELL AND METHOD OF FORMING SAME

BACKGROUND

This disclosure relates to fabrication of thin film photovoltaic solar cells.

Solar cells are electrical devices for generation of electrical current from sunlight by the photovoltaic (PV) effect. Thin film solar cells have one or more layers of thin films of PV materials deposited on a substrate. The film thickness of the PV materials can be on the order of nanometers or micrometers.

Examples of thin film PV materials used as absorber layers in solar cells include copper indium gallium selenide (CIGS) and cadmium telluride. Absorber layers absorb light for conversion into electrical current. Solar cells also include front and back contact layers to assist in light trapping and photocurrent extraction and to provide electrical contacts for the solar cell. Many solar cells also include buffer layers as intermediate layers between the absorber and front contact layers to improve layer interface properties and protect the absorber during further processing. However, some commonly-used processes for deposition of thin films result in damage to the thin film substructures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
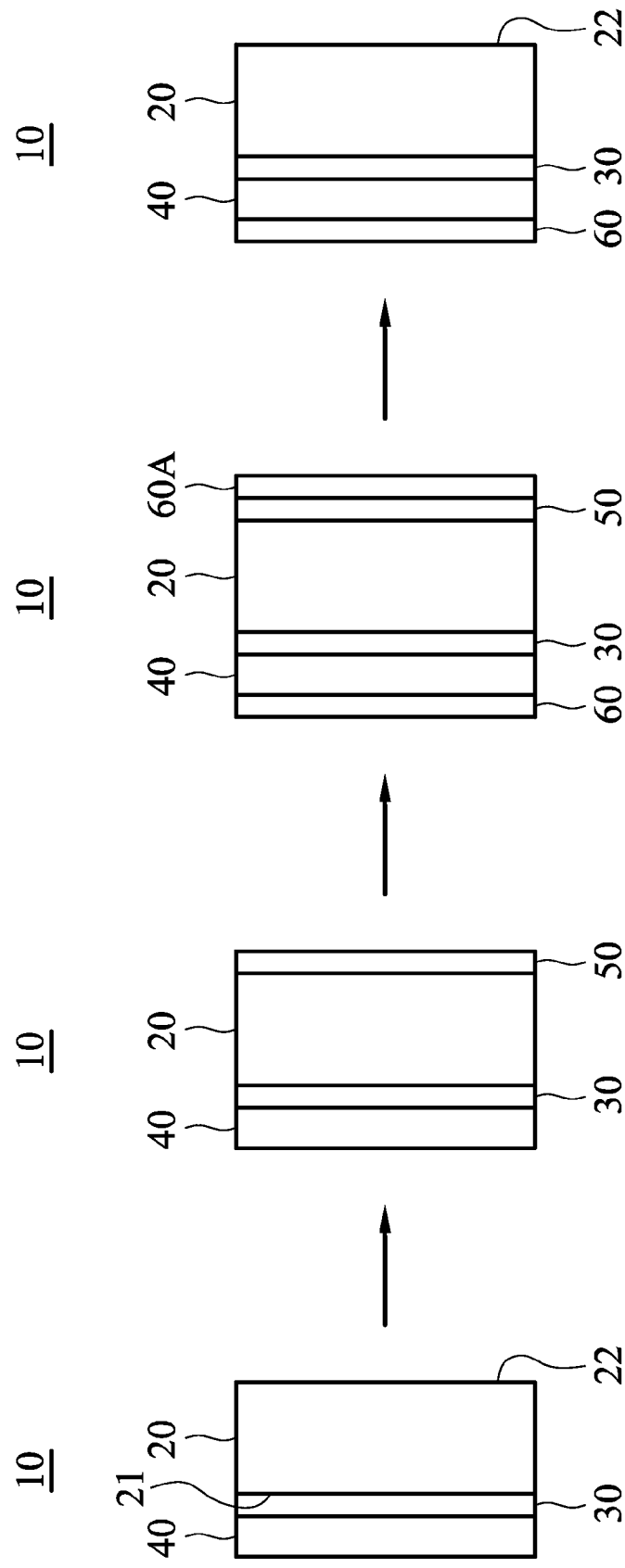
FIGS. 1A-1D are schematic cross-sectional views of a solar cell substructure in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further details of the method and structures formed according to the methods are provided in conjunction with the accompanying figures. The descriptions of the exemplary embodiments is intended to be read in connection with the figures of the accompanying drawing, which are to be considered part of the entire written description.

FIGS. 1A through 1D show cross-sections of a solar cell substructure 10 according to some embodiments. In some embodiments, a solar cell substructure 10 includes a back contact layer 30 on a front side 21 of a substrate 20, an absorber layer 40 on the back contact layer 30, and a protective layer 50 on a back side 22 of the substrate 20. The solar cell substructure 10 can also include a buffer layer 60 over the absorber layer 40.

Figure 2:
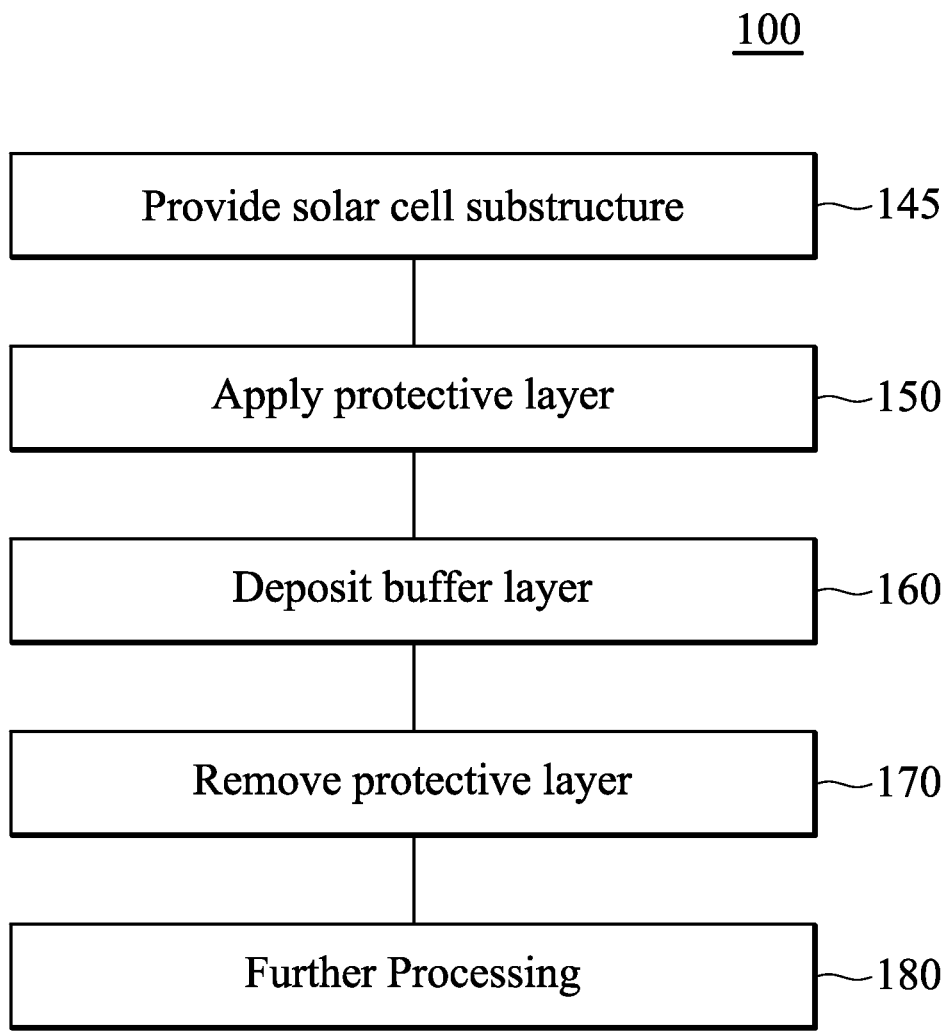
FIG. 2 is a flow chart of a method of fabricating a solar cell in accordance with some embodiments.
Figure 3:
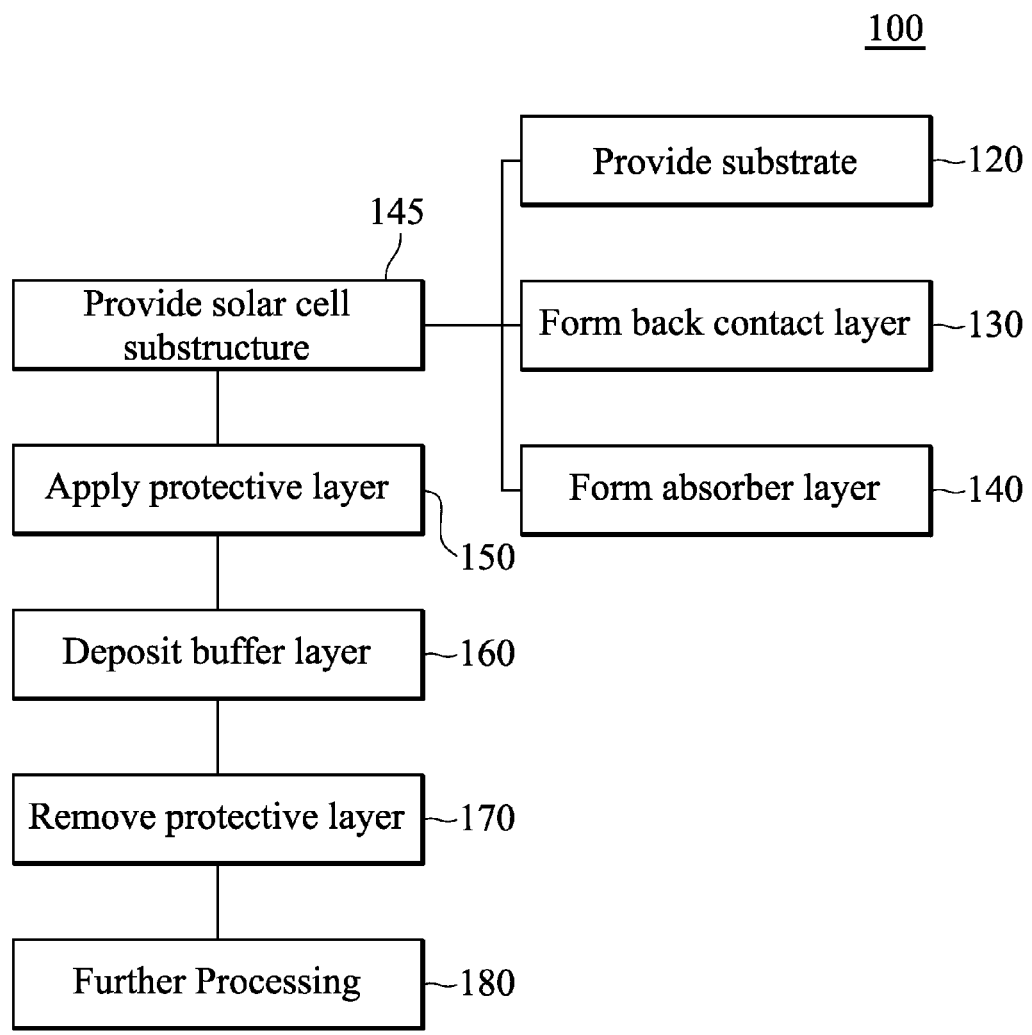
FIG. 3 is a flow chart of a method of fabricating a solar cell in accordance with some embodiments.

FIG. 2 shows a flowchart describing a broad method 100 for fabricating a solar cell. At step 145, a solar cell substructure is provided. In some embodiments as shown in FIG. 3, step 145 can include substep 120 for providing a substrate, substep 130 for forming a back contact layer over the substrate, and substep 140 for forming an absorber layer over the substrate and/or back contact layer. As shown in FIG. 1A, the solar cell substructure 10 provided at step 145 can include the back contact layer 30 over the substrate 20 and the absorber layer 40 over the back contact layer 30. In some embodiments, the back contact layer 30 is formed directly on the substrate 20, and the absorber layer 40 is formed directly on the back contact layer 30.

The substrate 20 comprises any suitable substrate material. In some embodiments, the substrate 20 can include a glass substrate, such as soda lime glass, or a flexible metal foil or plastic film. In some embodiments, the thickness of the substrate 20 can range from about 50 nm to about 2 μm. For example, in some embodiments, the thickness can deviate by plus or minus 0.5 nm, or plus or minus 1 nm, or plus or minus 5 nm.

The back contact layer 30 comprises any suitable conductive material, such as metals. In some embodiments, the back contact layer 30 can include molybdenum (Mo), platinum (Pt), gold (Au), silver (Ag), nickel (Ni), or copper (Cu). The back contact layer 30 can be selected based on the type of thin film solar cell device. For example, in a Cu(In,Ga)Se$_2$ (CIGS) solar device 10, back contact layer 30 is Mo in some embodiments. In other embodiments, a cadmium telluride (CdTe) solar device 10 has a copper or nickel back contact layer 30. In some embodiments, the thickness of the back contact layer 30 can range from about 50 nm to about 2 μm.

The absorber layer 40 comprises any suitable absorber material, such as p-type semiconductors. In some embodiments, the absorber layer 40 can comprise a thin film and can include CIGS; other chalcopyrite-based material such as CuInSe$_2$ (CIS), CuGaSe$_2$ (CGS), Cu(In,Ga)(Se,S)$_2$ (CIGSS); CdTe; or amorphous silicon (α-Si). In some embodiments, the thickness of the absorber layer 40 can range from about 0.3 μm to about 10 μm. The absorber layer 40 can be formed over the substrate 20 and back contact layer 30 according to methods such as sputtering, chemical vapor deposition, printing, electrodeposition or the like. For example, CIGS can be formed by first sputtering a metal film comprising copper, indium and gallium at a specific ratio, followed by a selenization process including introducing selenium or selenium-containing chemicals in a gas state into the metal firm. In some embodiments, the selenium is deposited by evaporation.

At step 150, the protective layer 50 is applied on the absorber layer 40 over the substrate 20. As shown in FIG. 1B, the protective layer 50 is applied on the back side 22 of the substrate 20. In some embodiments, the protective layer 50 is stable. As used herein, "stable" means thermally resistant (including resistance to degradation at temperatures up to at least 100° C. and in some instances up to 120° C. or 150° C.), and chemically resistant (including resistance to degradation by chemical reaction with moisture and other solutions). In some embodiments, the protective layer 50 includes an electrostatic material. For example, the protective layer 50 can include materials such as polyethylene terephthalate, polyvinyl chloride, poly propylene, polyethylene vinyl acetate, and polyamide. In some embodiments, the protective layer 50 includes an adhesive. In some embodiments, the protective layer 50 is removable. For example, the protective layer 50 can be attached to the substrate 20 via an adhesive and removed from the substrate 20 by mechanical means (e.g., by peeling). In other embodiments, the protective layer 50 includes an electrostatic tape (e.g., polyimide or polyester electrostatic tape). In some embodiments, a thickness of the protective layer 50 can range from about 0.5 mm to about 5 mm.

Figure 4C:
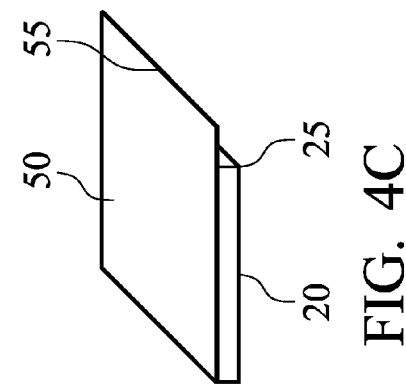
FIGS. 4A-4E are bottom perspective views of a solar cell substructure in accordance with some embodiments.
Figure 4E:
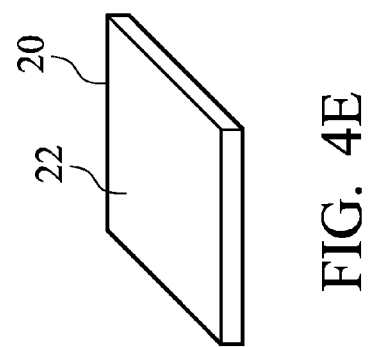
Figure 4B:
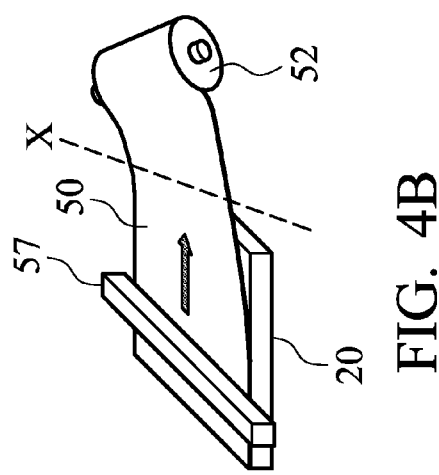
Figure 4D:
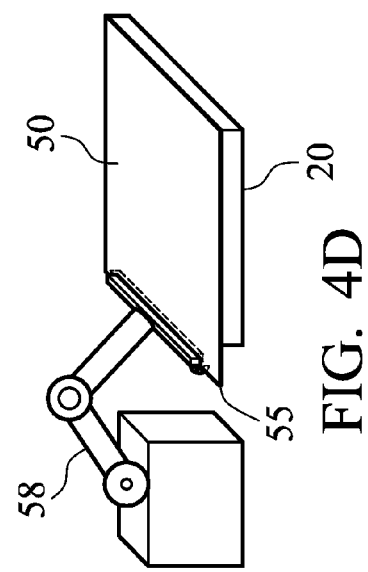
Figure 4A:
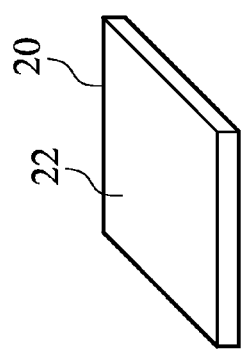

As shown in FIGS. 4A through 4C, the step of applying the protective layer 50 can include covering the back side 22 of the substrate 20 and pressing the protective layer 50 against the back side 22. For example, the protective layer 50 can be positioned on the substrate 20 and then pressure (e.g. about 1 newton) can be applied to the protective layer 50 to secure the layer 50 to the substrate 20. In embodiments where the protective layer 50 comprises a pressure-sensitive adhesive tape, the protective layer 50 can be applied from a tape roll 52. The protective layer 50 can be rolled out over the back side 22 of the substrate 20, pressed against the substrate 20 with a smoothing device 57 extending the width of the tape 50 and/or the substrate 20, and cut along line X as shown in FIG. 4B, leaving the protective layer 50 with a free end 55 extending past an edge 25 of the substrate 20 as shown in FIG. 4C.

At step 160, the buffer layer is applied over the absorber layer. The buffer layer comprises any suitable buffer material, such as n-type semiconductors. In some embodiments, the buffer layer can include cadmium sulfide (CdS), zinc sulfide (ZnS), zinc selenide (ZnSe), indium(III) sulfide ($In_2S_3$), indium selenide ($In_2Se_3$), or $Zn_{1-x}Mg_xO$, (e.g., ZnO). In some embodiments, a thickness of the buffer layer can range from about 5 nm to about 100 nm. The buffer layer can be formed through suitable processes such as physical deposition (e.g., sputtering) or chemical deposition (e.g., chemical bath deposition (CBD)).

Figure 5:
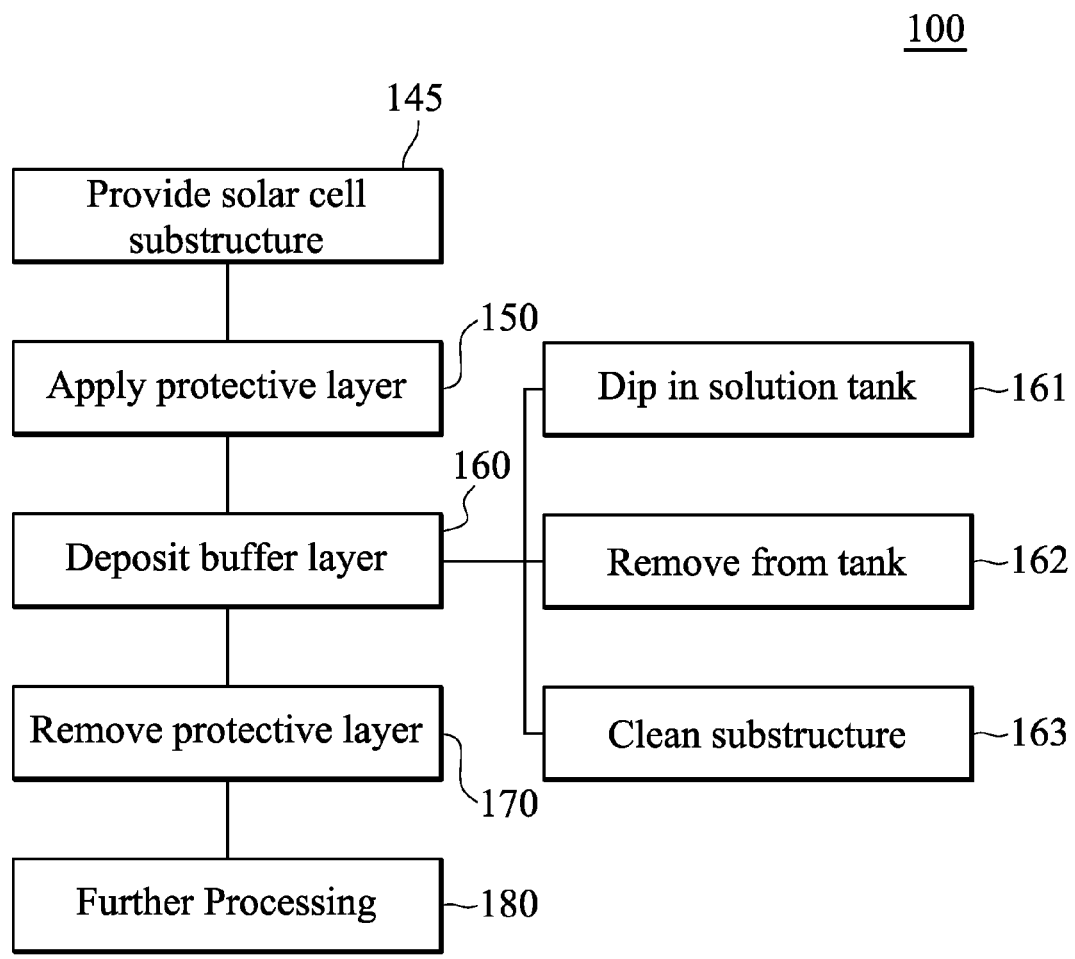
FIG. 5 is a flow chart of a method of fabricating a solar cell in accordance with some embodiments.

In some embodiments as shown in FIG. 5 step 160, the buffer layer can be deposited over the solar cell substructure by CBD. For example, the buffer layer can include CdS or ZnS deposited through CBD in a solution. At substep 161, the substructure is dipped in a buffer solution tank. The solution can include cadmium compounds (e.g. CdS, $CdI_2$), thiourea ($SC(NH_2)_2$) and ammonia for deposition of a CdS buffer layer. In some embodiments, the depositing step is performed a temperature in a range of about 5° C. to about 120° C., for example the dipping temperature can range of about 5° C. to about 120° C. For example, in some embodiments, the temperature can deviate by plus or minus 1° C., or plus or minus 2° C. As used herein, "dipping temperature" refers to the temperature of the solution in the tank while the substructure is submerged in solution. The dipping temperature can be a constant bath temperature or a maximum temperature to which the bath is raised while the substructure is submerged.

In some embodiments, the dipping temperature can be about 5° C. or more, 10° C. or more, 25° C. or more, 40° C. or more, 50° C. or more, 55° C. or more, 75° C. or more, 90° C. or more, 100° C. or more, 110° C. or more, and 120° C. or more. In other embodiments, the dipping temperature can be about 200° C. or less, 150° C. or less, 125° C. or less, 120° C. or less, 115° C. or less, 100° C. or more, and 90° C. or less. In other embodiments, the dipping temperature can range between a combination of the foregoing. For example, ranging from about 5° C. to 120° C., 25° C. to 100° C., 50° C. to 100° C., 75° C. to 120° C., and 80° C. to 150° C. In some embodiments, the temperature can deviate by plus or minus 1 degree, or plus or minus 2 degrees. Deviations can be greater for higher temperatures (e.g., greater than 50° C.), for example, plus or minus 5° C.

As used herein, "dipping time" refers to the period that the substructure is submerged in solution. In some embodiments, the dipping time in the buffer solution can be about 10 minutes (min) or more, 15 min or more, 30 min or more, 45 min or more, and 60 min or more. In other embodiments, the dipping time can be about 60 min or less, 50 min or less, 45 min or less, 30 min or less, 25 min or less, and 20 min or less. In other embodiments, the dipping time can range between a combination of the foregoing. For example, ranging from about 10 to 60 min, 15 to 60 min, 15 to 20 min, and 25 to 50 min. In some embodiments, the time can deviate by plus or minus 1 minute, or plus or minus 5 minutes.

At substep 162, the substructure is removed from the solution tank. At substep 163, the substructure can be cleaned, including removing excess solution. For example, the substructure can be dipped in a deionized (DI) water rinse to remove excess solution. In some embodiments, the substructure can be dipped in a rinse for about 1 min or more, 5 min or more, 10 min or more, 15 min or more, and 20 min or more. In other embodiments, the substructure can be dipped in a rinse for about 20 min or less, 18 min or less, 15 min or less, and 10 min or less. In other embodiments, the time can range between a combination of the foregoing. For example, about 1 to 20 min, 5 to 10 min, and 5-15 min. In some embodiments, the time can deviate by plus or minus 1 minute, or plus or minus 2 minutes. Step 160 can also include additional processes, such as drying the substructure after dipping and/or cleaning. As shown in FIG. 1C, deposition methods such as CBD can be imprecise and buffer material can be deposited around the substructure, including deposition of excess buffer material 60A in undesirable locations such as over the back side 22 of the substrate 20.

At step 170, the protective layer is removed from the substructure. Removing the protective layer can include removing any excess buffer material on the protective layer, leaving the solar cell substructure 10 as shown in FIG. 1D. Removing the protective layer 50 can include gripping the protective layer 50 at the free end 51 as shown in FIG. 4D and detaching the protective layer 50 from the substructure, revealing the back side 22 of the substrate 20 as shown in FIG. 4E. In some embodiments, the method 100 can employ a roller system in and/or between one or more of the steps 120-180. For example, during step 160 the substructure can be transferred to a roller system and a removing arm 58 can be integrated between rollers to perform step 170.

In some embodiments at step 170, the solar cell can undergo additional processing operations. For example, further processing can include forming front contact, scribing, EVA/butyl applications, lamination, back end processing, testing and module formation. Solar modules can in turn be coupled to other solar modules in series or in parallel to form an array.

Example

In one example, a solar cell device can be fabricated according to a method described herein. A glass substrate can be provided and cleaned. A back contact layer of Mo can be deposited on the front side of the substrate and a P1 line can be scribed through the back contact layer. A CIGS absorber layer can be formed over the back contact layer, including filling the P1 scribe line. A protective layer of PET adhesive tape can be applied on the back side of the substrate. The protective layer can be positioned over the back side of the substrate, and a blade can be used to smooth and press the protective layer, securing it in place on the substrate.

The substructure with the attached protective layer can be dipped in a CBD tank containing a solution of water, ammonia, cadmium sulfate, thiourea, forming a CdS buffer layer around the substructure—including on the absorber layer and on the back side of the glass substrate. The substructure can be removed from the solution tank and dipped in a DI water tank, then the protective tape can be peeled from the back side of the substrate.

A P2 line can be scribed through the buffer layer and the absorber layer. A transparent conductive oxide (TCO) front contact layer can be formed over the buffer layer, including filling the P2 scribe line; and a P3 line can be scribed through the front contact layer, buffer layer and absorber layer. The fabricated solar cell can undergo further processing including edge deletion, bus bar bonding, and lamination.

Although particular examples are described above, the structures and methods described herein can be applied to a broad variety of thin film solar cells, such as a-Si thin film, CIGS, and CdTe with pn junction, p-i-n stricture, MIS structure, multi-junction, and the like.

The disclosure provides for improved solar cell devices and substructures, including more efficient and effective methods for fabricating devices and substructures. In particular, the method can eliminate the use of a corrosive wiping procedure to remove excess buffer material from the back side of the substrate. The wiping procedure typically uses water, a solvent (such as ethanol or isopropanol), and an acid such as HCl. However, the acid solution or vapor also deposits on the surface of the buffer layer and hinders subsequent front contact deposition. In some cases, gaps are left in the front contact layer. The method described herein does not require a corrosive wiping procedure and not only provides an easily controllable and improved application of the buffer layer in solar cell fabrication but also provides for a better quality front contact layer and improved device performance.

In some embodiments, a method for fabricating a solar cell is provided. The method includes forming a back contact layer on a front side of a substrate, forming an absorber layer on the back contact layer, applying a protective layer on a back side of the substrate, depositing a buffer layer on the absorber layer wherein excess buffer materials are deposited on the substrate back side during the depositing, and removing the protective layer and the excess buffer materials thereon.

In some embodiments, the depositing step is performed by chemical bath deposition (CBD).

In some embodiments, the depositing step includes dipping the absorber layer in a buffer solution tank, and cleaning the absorber layer to remove the buffer solution from the absorber layer.

In some embodiments, the depositing step is performed at a temperature in a range of about 5° C. to about 120° C.

In some embodiments, the dipping step is performed at a constant bath temperature in a range of about 5° C. to about 120° C.

In some embodiments, the dipping step is performed at a constant bath temperature in a range of about 50° C. to about 100° C.

In some embodiments, the dipping step includes immersing said absorber layer in said buffer solution tank for a period of about 15 minutes or more.

In some embodiments, a method for fabricating a solar cell is provided. The method includes providing a solar cell substructure including an absorber layer over a front side of a substrate, applying a protective layer on a back side of the substrate opposite the front side, depositing a buffer layer around the solar cell substructure including depositing the buffer layer on the absorber layer, and removing the protective layer from the substructure.

In some embodiments, the protective layer includes an electrostatic material.

In some embodiments, the protective layer includes an adhesive.

In some embodiments, the protective layer includes an electrostatic tape.

In some embodiments, the protective layer includes a material selected from a group including polyethylene terephthalate, polyvinyl chloride, poly propylene, polyethylene vinyl acetate, and polyamide.

In some embodiments, the protective layer has a thickness in a range of about 0.5 mm to about 5 mm.

In some embodiments, the applying step includes covering the back side with the protective layer and pressing the protective layer against the back side.

In some embodiments, the protective layer is applied so as to include a free end extending past an edge of the substrate, and the removing step includes gripping the protective layer at the free end and detaching the protective layer from the substructure.

In some embodiments, the absorber includes CIGS.

In some embodiments, the buffer layer includes CdS.

In some embodiments, a solar cell substructure is disclosed. The solar cell substructure includes a back contact layer over a front side of a substrate, an absorber layer over the back contact layer, and a protective layer on a back side of the substrate.

In some embodiments, the protective layer includes an electrostatic tape.

In some embodiments, the solar cell substructure also includes a buffer layer comprising buffer layer material on the absorber layer and additional buffer layer material on the protective layer.

The descriptions of the fabrication techniques for exemplary embodiments can be performed using any suitable commercially available equipment commonly used in the art to manufacture solar cell devices, or alternatively, using future developed equipment and techniques.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a solar cell, comprising:
forming a back contact layer on a front side of a substrate;
forming an absorber layer on the back contact layer;
applying a protective layer on a back side of said substrate;
depositing a buffer layer on said absorber layer, wherein excess buffer materials are deposited on said substrate back side during said depositing; and
removing said protective layer and said excess buffer materials thereon.

2. The method as in claim 1, wherein said depositing step is performed by chemical bath deposition (CBD).

3. The method as in claim 1, wherein said depositing step comprises:
dipping said absorber layer in a buffer solution tank; and
cleaning said absorber layer to remove said buffer solution from said absorber layer.

4. The method as in claim 1, wherein said depositing step is performed at a temperature in a range of about 5° C. to about 120° C.

5. The method as in claim 2, wherein said dipping step is performed at a constant bath temperature in a range of about 5° C. to about 120° C.

6. The method as in claim 2, wherein said dipping step is performed at a constant bath temperature in a range of about 50° C. to about 100° C.

7. The method as in claim 2, wherein said dipping step comprises immersing said absorber layer in said buffer solution tank for a period of about 15 minutes or more.

8. The method as in claim 1, wherein said protective layer comprises an electrostatic material.

9. The method as in claim 1, wherein said protective layer comprises a adhesive.

10. The method as in claim 1, wherein said protective layer comprises an electrostatic tape.

11. The method as in claim 1, wherein said protective layer comprises a material selected from a group comprising polyethylene terephthalate, polyvinyl chloride, poly propylene, polyethylene vinyl acetate, and polyamide.

12. The method as in claim 1, wherein said protective layer has a thickness in a range of about 0.5 mm to about 5 mm.

13. The method as in claim 1, wherein said applying step comprises covering said back side with said protective layer and pressing said protective layer against said back side.

14. The method as in claim 1, wherein said protective layer is applied so as to include a free end extending past an edge of said substrate, and said removing step comprises:
gripping said protective layer at said free end; and
detaching said protective layer from said substructure.

15. The method as in claim 1, wherein said absorber comprises copper indium gallium selenide (CIGS).

16. The method as in claim 1, wherein said buffer layer comprises cadmium sulfide (CdS).

17. A method for fabricating a solar cell, comprising:
providing a solar cell substructure comprising a back contact layer over a front side of a substrate and an absorber layer over said back contact layer;
applying a tape on a back side of said substrate opposite the front side;
depositing a buffer layer around said solar cell substructure including depositing the buffer layer on said absorber layer and excess buffer materials on said tape; and
removing said tape from said substructure and said excess buffer materials thereon.

18. The method as in claim 17, wherein the step of applying the tape includes applying the tape from a tape roll.

19. A method for fabricating a solar cell, comprising:
forming a back contact layer on a front side of a substrate;
forming an absorber layer on the back contact layer;
applying a protective layer on a back side of said substrate;
depositing a buffer material on said absorber layer and said protective layer using a chemical bath deposition; and
removing said protective layer and the buffer material on the protective layer from said back side.

20. The method as in claim 19, wherein said removing step is performed using a roller system to transport said solar cell.

* * * * *